(12) United States Patent
Schörner et al.

(10) Patent No.: US 12,213,290 B2
(45) Date of Patent: Jan. 28, 2025

(54) ELECTRICAL DEVICE AND METHOD FOR PRODUCING A FIRST AND SECOND ELECTRICAL DEVICE FROM A KIT

(71) Applicant: SEW-EURODRIVE GMBH & CO. KG, Bruchsal (DE)

(72) Inventors: Martin Schörner, Bruchsal (DE); Thomas Wetzel, Ubstadt-Weiher (DE); Rolf Janzer, Bruchsal (DE)

(73) Assignee: SEW-EURODRIVE GMBH & CO. KG, Bruchsal (DE)

( * ) Notice: Subject to any disclaimer, the term of this patent is extended or adjusted under 35 U.S.C. 154(b) by 229 days.

(21) Appl. No.: 17/642,475

(22) PCT Filed: Sep. 1, 2020

(86) PCT No.: PCT/EP2020/025394
§ 371 (c)(1),
(2) Date: Mar. 11, 2022

(87) PCT Pub. No.: WO2021/047793
PCT Pub. Date: Mar. 18, 2021

(65) Prior Publication Data
US 2022/0312628 A1    Sep. 29, 2022

(30) Foreign Application Priority Data

Sep. 12, 2019  (DE) .......................... 102019006434.8

(51) Int. Cl.
*H05K 7/20*     (2006.01)
*H05K 1/02*     (2006.01)

(52) U.S. Cl.
CPC ........... *H05K 7/209* (2013.01); *H05K 1/0203* (2013.01); *H05K 7/20909* (2013.01)

(58) Field of Classification Search
CPC .............. H05K 7/209; H05K 7/20909; H05K 7/20854; H05K 7/2049; H05K 1/0203;
(Continued)

(56) References Cited

U.S. PATENT DOCUMENTS 6,400,577 B1 *  6/2002  Goodwin ............. H05K 7/1084
174/548
6,442,045 B1    8/2002  Goodwin
(Continued)

FOREIGN PATENT DOCUMENTS

DE     202008001996 U1    6/2008
DE     102011010429 A1    8/2012
(Continued)

OTHER PUBLICATIONS

Bruch, Helmut et al; "Electrical Unit"; May 4, 1995; Siemens AG; Translation found in PE2E Search (Year: 1995).*
(Continued)

*Primary Examiner* — Stephen S Sul
*Assistant Examiner* — Jeffrey Francis Stoll
(74) *Attorney, Agent, or Firm* — Carter, DeLuca & Farrell LLP (57) ABSTRACT

In an electrical device and method for producing a first and second electrical device from a construction kit, the electrical device includes a heat sink having a contact surface, on which a power module is arranged. A frame part of the electrical device is arranged on the contact surface, the power module is accommodated in the frame part, and the frame part is delimited by a bulge of the heat sink protruding at the edge of the contact surface.

27 Claims, 6 Drawing Sheets

(58) Field of Classification Search
CPC ... H05K 1/141; H01L 23/4006; H01L 23/367; H01L 23/3735; H01L 23/34; H01L 25/072; H02M 7/003; G06F 1/20
See application file for complete search history.

(56) References Cited

U.S. PATENT DOCUMENTS

| | | | |
|---|---|---|---|
| 6,639,800 | B1 | 10/2003 | Eyman |
| 6,702,588 | B1 * | 3/2004 | McHugh ............ H01R 12/7064 439/71 |
| 7,682,160 | B2 * | 3/2010 | Liao ..................... H05K 7/1069 439/71 |
| 7,944,695 | B2 * | 5/2011 | Nuki ..................... H05K 7/209 257/718 |
| 7,952,879 | B1 | 5/2011 | Vinciarelli |
| D837,753 | S | 1/2019 | Azar |
| 2001/0026440 | A1 | 10/2001 | Mellberg |
| 2003/0000080 | A1 | 1/2003 | Colbert |
| 2004/0252461 | A1 | 12/2004 | Wu |
| 2007/0258194 | A1 | 11/2007 | Okayama |
| 2008/0007919 | A1 * | 1/2008 | Isomoto ................. H05K 7/209 361/709 |
| 2011/0299253 | A1 * | 12/2011 | Nabilek ................. H05K 3/325 361/728 |
| 2014/0198454 | A1 | 7/2014 | Yuan |
| 2015/0156927 | A1 * | 6/2015 | Tsuboi ............... H05K 7/20854 361/704 |
| 2015/0173168 | A1 * | 6/2015 | Jiang .................... H05K 1/0209 361/720 |
| 2016/0218454 | A1 | 7/2016 | Chang |
| 2019/0306985 | A1 * | 10/2019 | Ferguson ............... H01R 12/88 |
| 2020/0413564 | A1 | 12/2020 | Schörner |

FOREIGN PATENT DOCUMENTS

| | | | | |
|---|---|---|---|---|
| DE | 102019001113 A1 | | 9/2019 | |
| EP | 1124407 A2 | * | 8/2001 | .......... H05K 7/1061 |
| EP | 1796448 A2 | * | 6/2007 | ............ H05K 7/209 |
| JP | 2014110734 A | | 6/2014 | |
| WO | WO-9512227 A1 | * | 5/1995 | ......... H01R 12/7005 |

OTHER PUBLICATIONS

International Report on Patentability issued in corresponding International Application No. PCT/EP2020/025394 dated Mar. 15, 2022, pp. 1-11, English Translation.

International Search Report issued in corresponding International Application No. PCT/EP2020/025394 dated Nov. 23, 2020, pp. 1-3, English Translation.

* cited by examiner

ELECTRICAL DEVICE AND METHOD FOR PRODUCING A FIRST AND SECOND ELECTRICAL DEVICE FROM A KIT

FIELD OF THE INVENTION

The present invention relates to an electrical device and a method for producing a first and second electrical device from a construction kit.

BACKGROUND INFORMATION

In certain conventional systems, electrical devices include heat sinks.

U.S. Patent Application Publication No. 2004/0252461 describes a cooling arrangement with a mounting frame.

An arrangement for shielding unwanted electromagnetic radiation is described in U.S. Patent Application Publication No. 2001/0026440.

A cooling arrangement with multiple attachment points is described in U.S. Pat. No. 6,639,800.

German Patent Document No. 10 2019 001 113 describes an electrical appliance assembly having an electrical appliance attachable to a support element.

A positioning device for heat sinks is described in German Patent Document No. 20 2008 001 996.

A cooling arrangement for an integrated circuit is described in U.S. Pat. No. 6,442,045.

A heat sink is described in U.S. Design Pat. No. D837,753.

An electrical device, e.g., in particular a converter, is described in German Patent Document No. 10 2011 010 429.

SUMMARY

Example embodiments of the present invention provide an electrical device that can be produced in a cost-effective fashion.

According to an example embodiment of the present invention, an electrical device, e.g., an inverter or converter, includes a heat sink having a contact surface on which a power module is arranged, with a heat-conducting paste interposed between the contact surface and the power module. A frame part of the electrical device is arranged, e.g., placed, on the contact surface, and the power module is accommodated in the frame part. The frame part is delimited by a bulge of the heat sink protruding at the edge of the contact surface, the heat sink is metallic, and the frame part is made of plastic, as an injection-molded part.

The advantage here is that a large variety of electrical devices can be produced from a construction kit with only a small number of components. By using a frame part, it is possible to place a smaller power module on the contact surface than can be arranged on the contact surface, if the frame part is left out.

According to example embodiments, the power module is electrically connected to a printed circuit board arranged on the side of the power module facing away from the contact surface, and contacts of the power module for electrical contacting are arranged pressed onto conductor tracks of the printed circuit board. It is considered advantageous that electrical contact is made by pressing the printed circuit board against the spring-loaded or mounted contacts of the power module. Thus, no solder connection is necessary, and the power module can be arranged on the contact surface in a first production step and, in a subsequent second production step, the printed circuit board can be placed on and screwed onto the heat sink and/or a retaining plate can be placed on the printed circuit board and pressed on by means of a screw head of a screw, which is screwed into a threaded hole of the power module. The power module can be positioned relative to the printed circuit board by positioning pins formed on and protruding from the power module, in which the positioning pins and the screw pass through respective recesses in the printed circuit board.

According to example embodiments, a retaining plate is arranged on the side of the printed circuit board facing away from the power module, and is pressed onto the printed circuit board, by a screw head of a screw that is at least partially screwed into a threaded hole of the power module and is thus pressed onto the power module. The advantage is that it is readily possible to press the contacts of the power module against the conductor tracks of the printed circuit board.

According to example embodiments, the frame part has protruding projections, e.g., lugs, on its inner side facing the power module, and a plurality of the projections contacts the power module. The advantage is that the projections make possible approximate point contact and a spring-loaded arrangement. Thus, elastic centering of the power module on the contact surface can be achieved.

According to example embodiments, the power module is accommodated on the inside of the frame part and the outside of the frame part is accommodated by the heat sink, by the bulge. It is considered advantageous that the frame part is interposed between the bulge, which extends in an interrupted fashion around the contact surface, and the power module. Thus, the frame part itself is supported on the contact surface by positioning pin areas on the printed circuit board and receives and centers the power module. In turn, the frame part is supported by projections providing such point contact on the bulge extending around the contact surface in an interrupted fashion. The bulge is therefore not arranged to be uninterrupted in the circumferential direction around the contact surface, but rather with interruptions.

According to example embodiments, each of the projections is formed on a respective web, which delimits a respective slot, and the respective slot is less extended in the direction from the slot to the projection, than in the direction perpendicular to the direction. The advantage is that the web is thin and thus elastically deformable, such that the projection is also elastically deformable.

According to example embodiments, the frame part has protruding projections, e.g., lugs, on its outer side, toward the bulge formed on the heat sink. Several of these projections contact the bulge, and the bulge is formed in multiple pieces, i.e., having several parts. It is considered advantageous that the projections are elastically spring-loaded and thus cause the centering to be elastic.

According to example embodiments, the frame part has a positioning pin area, which is supported on the circuit board, on the side of the circuit board facing away from the retaining plate. The frame part is, for example, arranged in a delimiting fashion in all spatial directions.

According to example embodiments, the frame part has two spaced-apart slots on at least one shortest connecting line between the power module and the bulge, in which a first of the two slots are arranged closer to the power module, than is the second of the two slots. The slots are, for example, arranged as longitudinal slots, which are aligned parallel to the surface closest to them.

According to example embodiments, the power module has controllable semiconductor switches, e.g., IGBT or MOSFET, of an inverter. For example, the motor is provided with three-phase voltage.

According to example embodiments, the bulge is spaced apart from the PCB and the power module contacts both the heat sink, e.g., the contact surface of the heat sink, and thus the printed circuit board. The advantage is that the power module is centered in a simple manner.

According to example embodiments, the contact surface is flat. The advantage is that a low heat transfer resistance between the contact surface and the power module can be achieved.

According to example embodiments, the contact surface is aligned parallel to the printed circuit board, and the positioning pins are aligned perpendicular to the contact surface. For example, the positioning pins are subjected to pressure in the normal direction of the printed circuit board plane.

According to example embodiments, a cooling air flow conveyed by a fan is guided along the side of the heat sink facing away from the contact surface. The advantage is that efficient cooling of the heat-generating power module can be achieved since the heat is dissipated to the ambient air on the other side by the conveyed air flow.

According to example embodiments, components of signal electronics are arranged on the side of the printed circuit board facing away from the power module, and the signal electronics generate drive signals for controlling the controllable semiconductor switches of the power module. For example, the signal electronics are thermally separated from the power module by the printed circuit board acting as a thermal barrier or at least as a thermal resistor. The base material of the printed circuit board, for example, exhibits considerable thermal resistance, which is, however, reduced by vias. Nevertheless, a thermal resistance is achieved by the printed circuit board, which causes a temperature gradient between the power module and the spatial area of the signal electronics.

According to example embodiments of the present invention, in a method for producing a first and a second electrical device from a construction kit, optionally either the first electrical device is made of the frame part, the heat sink, and the first power module or the second electrical device is made of the second power module and the heat sink. The construction kit includes a first and a second power module, a frame part, and a heat sink having a contact surface, and the respective electrical device is arranged an inverter or converter. To produce the first electrical device, the first power module is arranged on the heat sink having the contact surface, with heat-conducting paste interposed between the contact surface and the first power module, the frame part is arranged on the contact surface, placed thereon, and the first power module is accommodated in the frame part, the frame part being delimited by a bulge of the heat sink protruding at the edge of the contact surface. To produce the second electrical device, the wide power module is arranged on the heat sink having the contact surface, with heat-conducting paste interposed between the contact surface and the power module, and the second power module is delimited by the bulge of the heat sink protruding at the edge of the contact surface.

The advantage is that a large variety of electrical devices can be produced from a small number of components of a construction kit. This is because the smaller first power module can be arranged on the same contact surface of the heat sink as the second power module by the small frame part. The frame part can be produced inexpensively as a plastic injection molded part and its cost is therefore negligible. However, only one type of heat sink is to be provided in the construction kit, i.e., also in the warehouse for the electrical equipment production plant. Thus, the quantities of the heat sinks are large, which is why the heat sinks can be produced at a low cost.

According to example embodiments, the area of the contact surface, where the first power module contacts the contact surface, has a smaller surface area than does the area of the contact surface, where the second power module contacts the contact surface. It is considered advantageous that optionally two power modules of different sizes can be arranged on the same contact surface. Thus, in the construction kit to produce the series of electrical devices only one type of heat sink is to be stored, i.e., the same heat sink that can be used for a power module of larger size can be used for the power module of smaller size.

Further features and aspects of example embodiments of the present invention are described in more detail below with reference to the appended schematic Figures.

DETAILED DESCRIPTION

As shown in the Figures, the converter has a housing 1 connected to a heat sink 3 which has a flat, finely machined, contact surface arranged toward the interior.

The contact surface is aligned parallel to the printed circuit board 6, which is spaced apart from the contact surface.

Protruding limiting knobs 25 are formed on the heat sink 3 at the edge of the contact surface, which is arranged substantially as a rectangle. These limiting knobs 25 protrude upward, i.e., toward the printed circuit board 6.

A frame part 4 is placed on the contact surface. The frame part 4 is arranged as a rectangular frame and has continuous longitudinal slots 8 in the normal direction of a plane accommodating the printed circuit board, such that the frame part 4 only has a small amount of material in the area surrounding the longitudinal slots 8, which can thus be deflected elastically in the direction perpendicular to the normal direction and to the slot direction.

The respective longitudinal slot is delimited by a thin web 10 of material, the web 10 being located at the inner edge of the frame part, when the associated slot area is arranged closer to the inner than to the outer edge of the frame part, and having an inwardly protruding projection 21, e.g., a lug.

However, if the respective slot area is located closer to the outer edge of the frame part than to the inner edge, the web rests against the outer edge of the frame part 4 and has an outwardly directed projection 23, e.g., a lug.

At the edge of the contact surface, a bulge 7a, 7b rises in the normal direction, at least in sections, however, the limiting knobs 25 project beyond this bulge.

The bulge rises in the normal direction at least equal to or more than the wall thickness of the frame part 4 in this normal direction.

Thus, the frame part 4 is delimited at its circumferential edge. For delimiting in the normal direction, positioning pin areas 22 are formed on the frame part 4 and supported on the printed circuit board 6.

By the projections 23, the frame part 4 contacts the heat sink 3, wherein the projections 23 are supported on the bulge of the heat sink 3. The projections 23 are formed on the webs delimiting the longitudinal slots and are thus arranged on the frame part 4 in an elastically spring-loaded manner.

Thus, the frame part 4 is fixed in all spatial directions between the contact surface of the heat sink 3 and the printed circuit board 6.

The power module 5 has controllable semiconductor switches of an inverter, which is provided for feeding an electric motor. The controllable semiconductor switches are arranged in half-bridges connected in parallel to each other and are supplied from a DC voltage, e.g., an intermediate circuit voltage. Each of the half-bridges makes available to the motor at its center tap one of the phase voltages of the alternating voltage, e.g., three-phase voltage, provided by the inverter.

The power module 5 is accommodated in the interior of the frame part 4, such that the power module 5 is surrounded by the frame part 4 in the directions perpendicular to the normal direction, and the power module 5 protrudes beyond the frame part 4 in the normal direction.

The power module 5 is placed on the contact surface, with interposed heat-conducting paste.

The projections 21, e.g., lugs, protruding inward toward the power module 5 on the inside of the frame part 4 contact the power module 5 and contribute to the positioning of the power module 5.

On its side facing away from the contact surface, the power module 5 has a positioning pin 20, which protrudes through a corresponding recess, e.g., through a hole, in the circuit board 6 into a recess in the retaining plate 2, and thus positions the power module 5 relative to the circuit board 6.

The retaining plate 2 arranged on the side of the circuit board 6 facing away from the power module 5 is screwed into a threaded hole of the power module 5 with a screw, which protrudes through the printed circuit board 6. The screw head of the screw then presses the retaining plate 2 onto the printed circuit board 6 and the latter onto the side of the power module 5 facing away from the contact surface. Thus, the printed circuit board 6 and the power module are also pressed together.

The frame part 4 has at least discrete rotational symmetry about an axis with a rotational angle of 180°, in which the axis is oriented parallel to the normal direction and passes through the center of gravity of the frame part 4.

As noted above, components of signal electronics 9 are arranged on the side of the printed circuit board facing away from the power module, and the signal electronics generate drive signals for controlling the controllable semiconductor switches of the power module.

Figure 1:
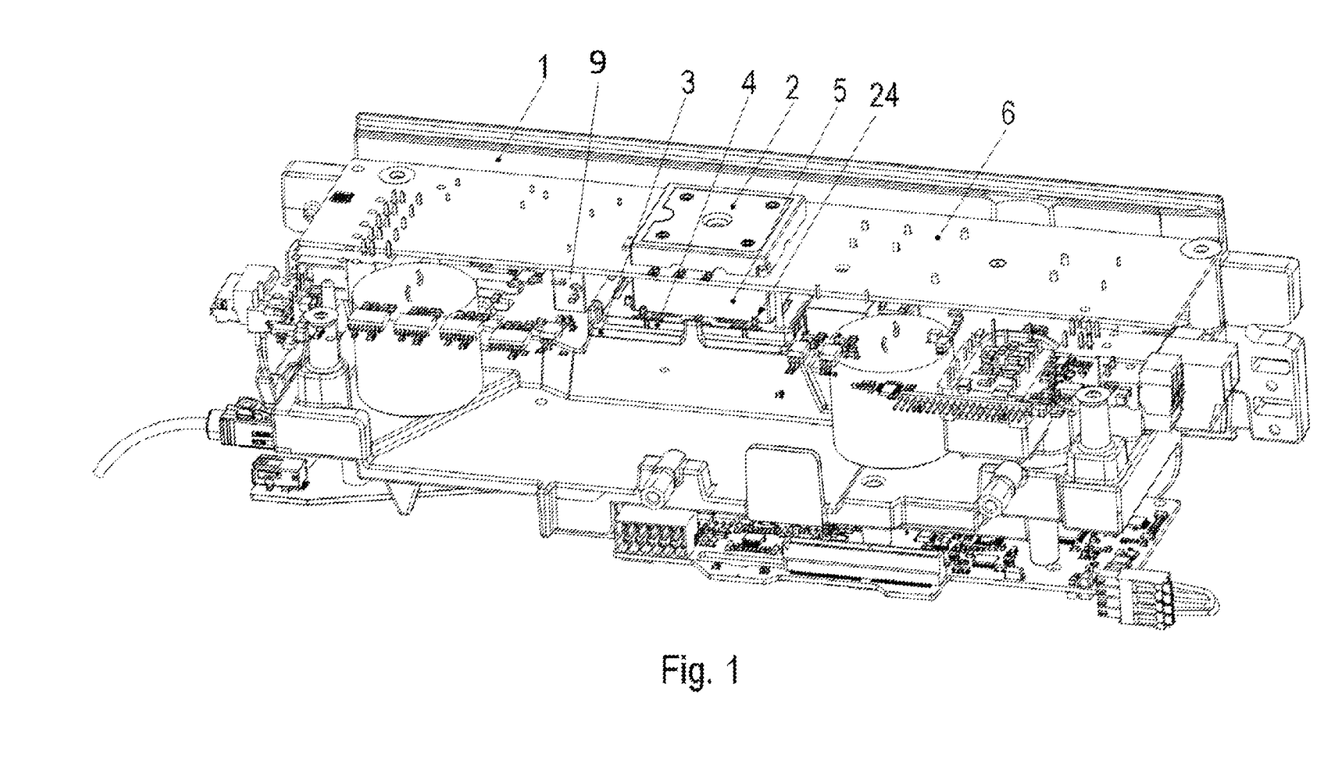
FIG. 1 is a perspective view of a converter according to an example embodiment of the present invention having a power module 5, a frame part 4, and a printed circuit board 6.
Figure 2:
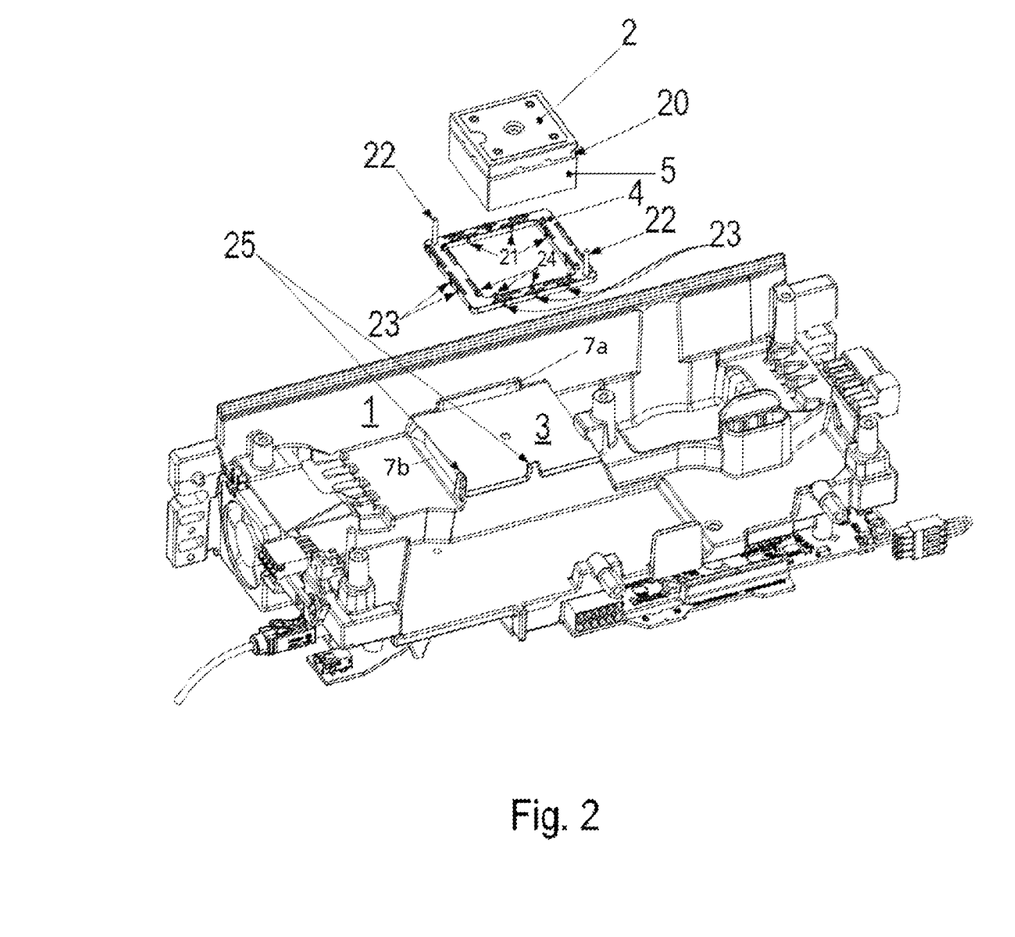
FIG. 2 is an exploded view of the power module 5 and the frame part 4 on the converter.
Figure 3:
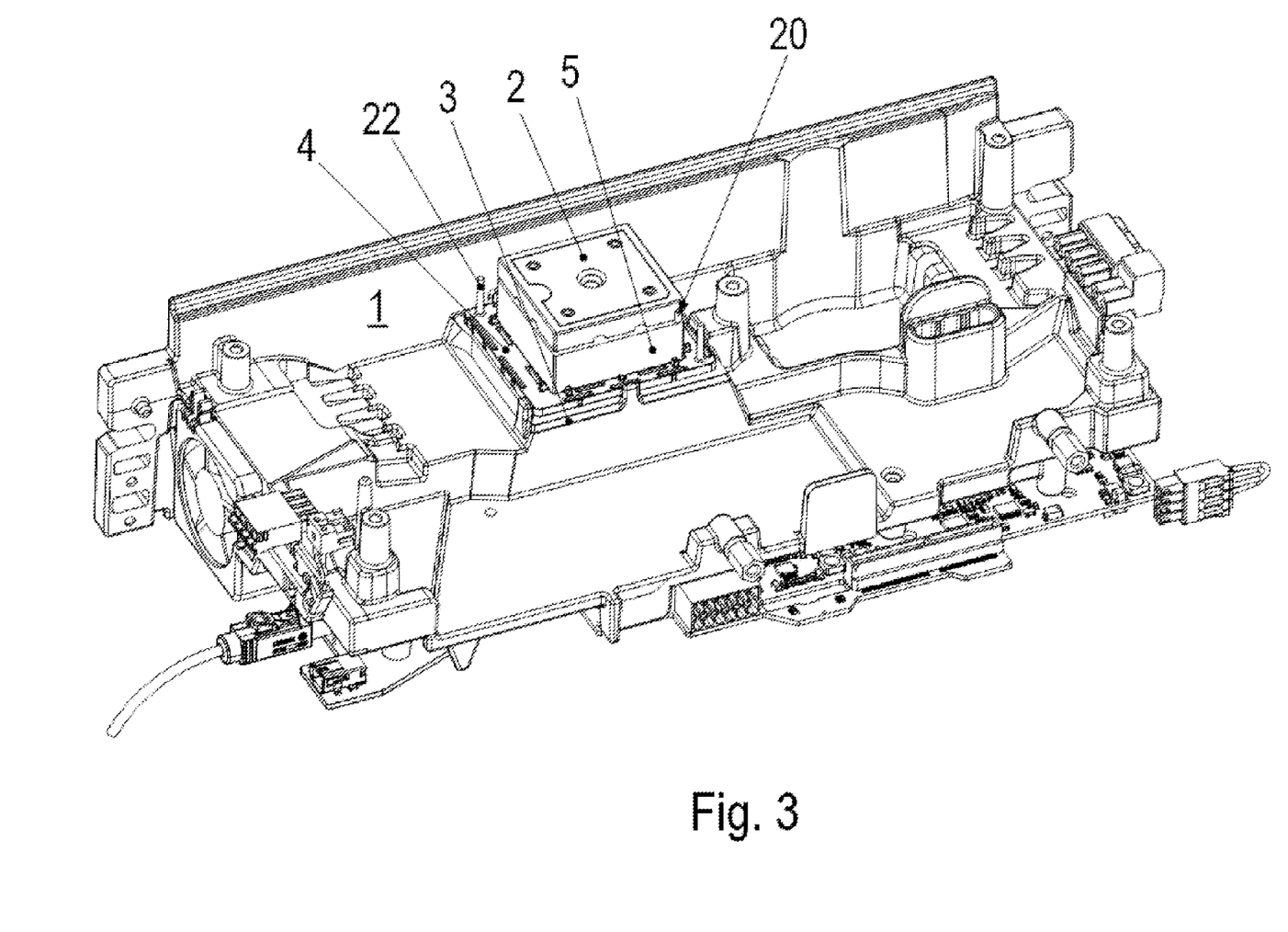
FIG. 3 is a perspective view of the sectioned converter.
Figure 4:
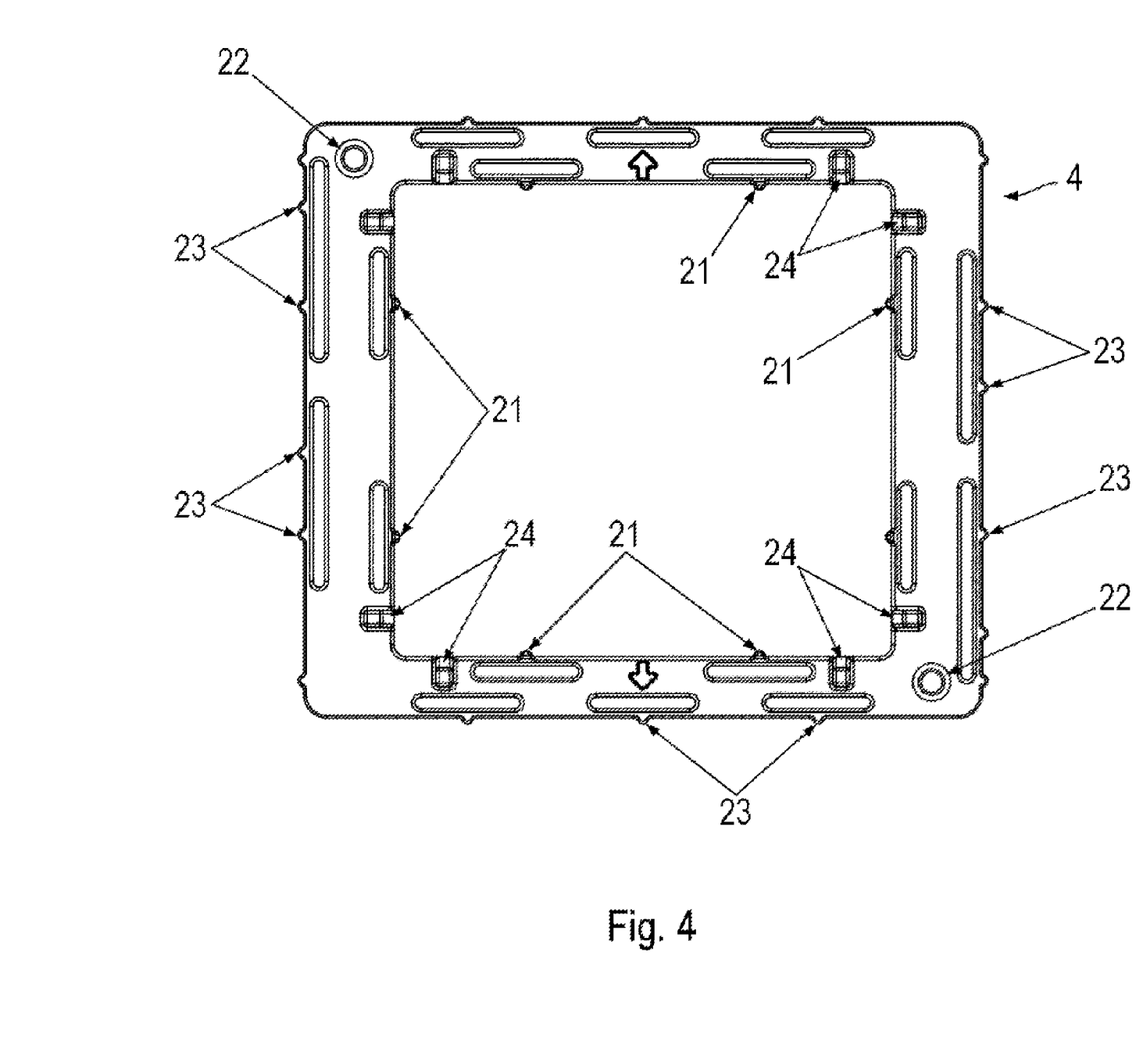
FIG. 4 is a top view of frame part 4.
Figure 5:
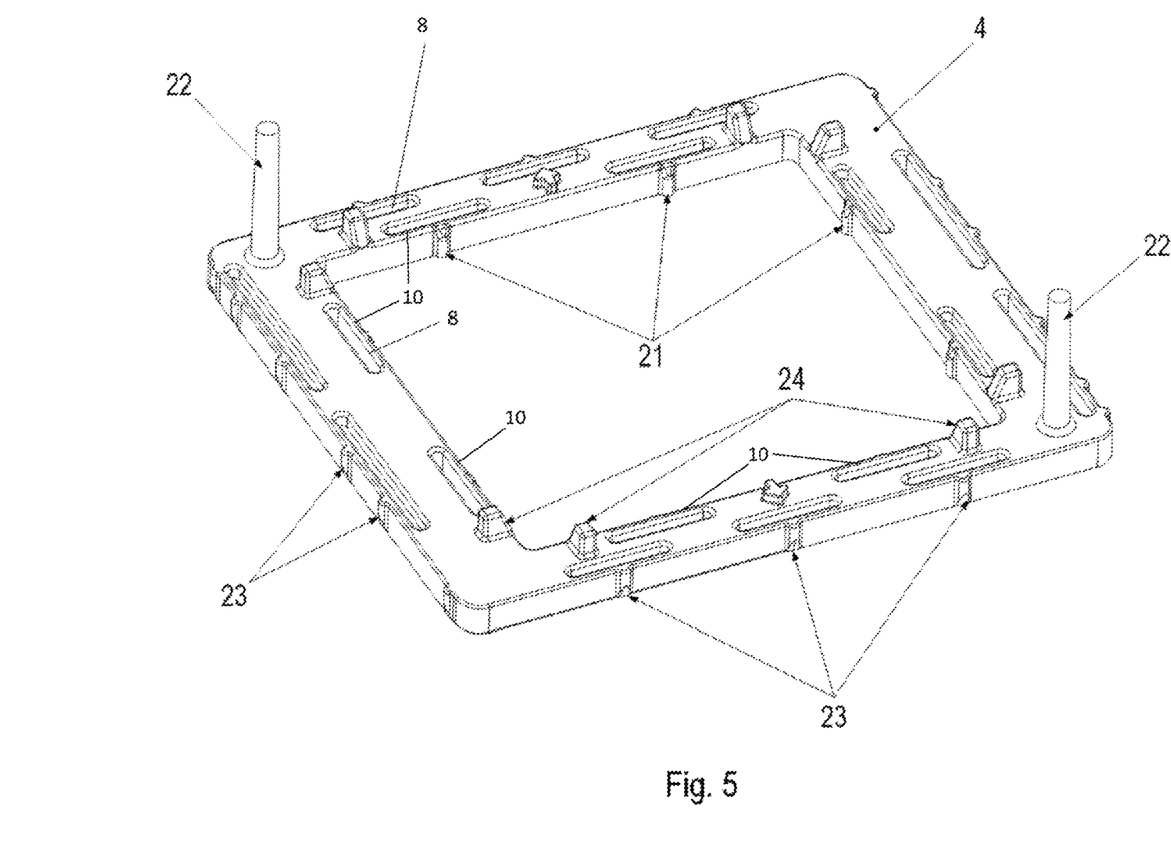
FIG. 5 is a perspective view of frame part 4.

As illustrated in FIG. 4, the projections 21, 23 are each arranged on a respective web, which delimits a respective slot, and the slot has its smallest extent in the direction directed from the slot to the associated projection and its greatest extent perpendicularly thereto, i.e., in the transverse direction.

Not all the projections 23 abut the bulge, e.g., since the bulge does not extend continuously in the circumferential direction, but rather with interruptions. Thus, the frame part 4 can also be used for other converters, in which the projections 23, which are not used in the arrangement illustrated in Figures, are used, i.e., they are in contact with bulge, which is differently shaped.

According to example embodiments, the housing 1 and the heat sink 3 are made in one piece, i.e., as a single part, e.g., as an aluminum casting.

Figure 6:
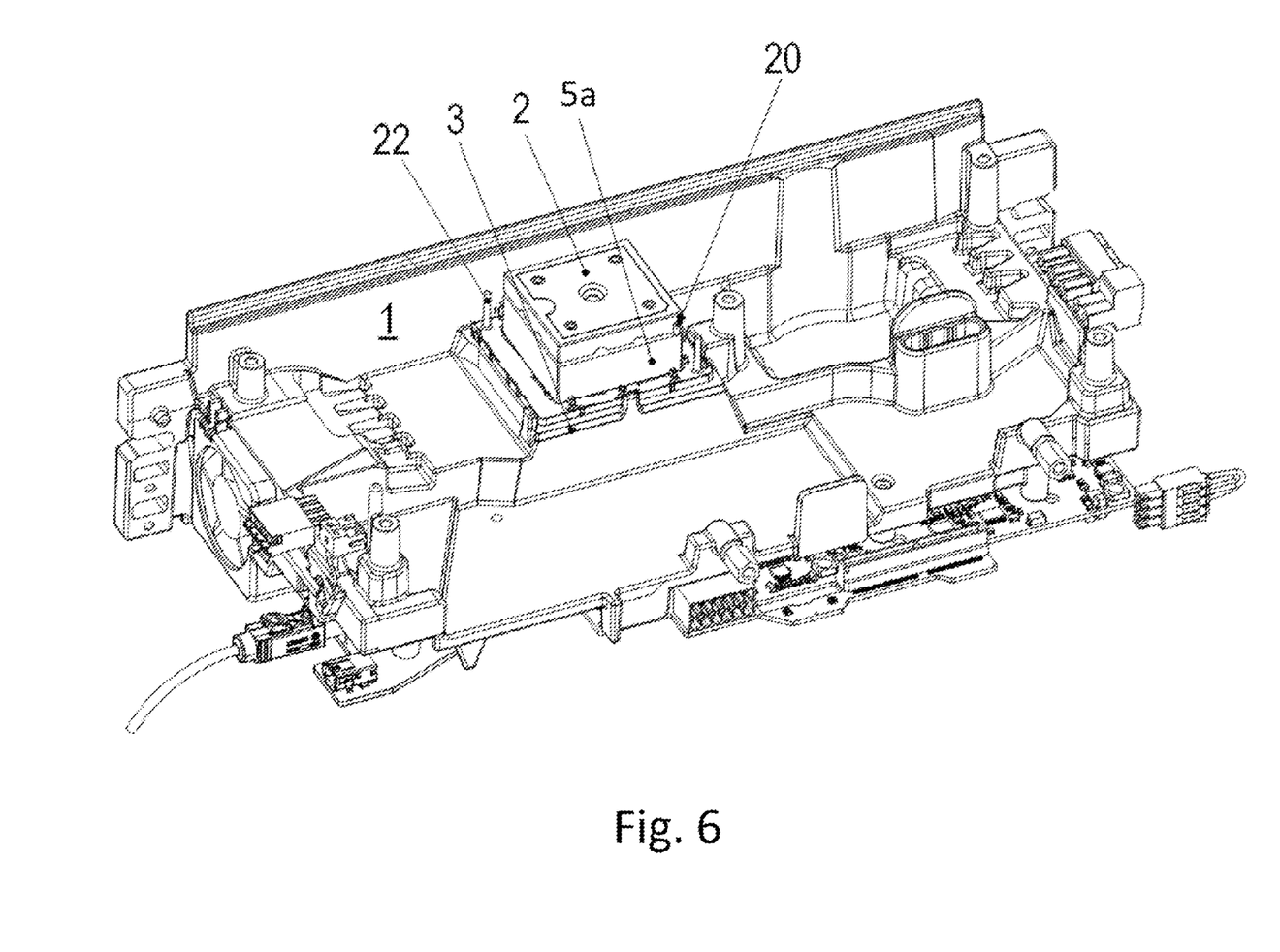
FIG. 6 is a perspective view of a converter according to an example embodiment of the present invention having a power module 5a, a frame part 4, and a printed circuit board 6.

According to exemplary embodiments, as illustrated in FIG. 6. a larger power module is used in comparison with the power module 5, such that frame part 4 is no longer required, and the power module 5a can be placed directly on the contact surface, and the protruding limiting knobs 25, which are formed on the heat sink 3 at the edge of the contact surface, delimit and/or center the power module.

According to exemplary embodiments, the converter is arranged only as an inverter, i.e., it has a DC voltage-side connection for supplying the controllable semiconductor switches of the power module. If required, unused rectifier diodes are arranged on the power module for rectifying the voltage of an AC voltage supply network. Instead of the inverter or converter, other electrical devices having a power module may also be provided.

The invention claimed is:

1. An electrical device, comprising:
   a heat sink having a contact surface;
   a power module arranged on the heat sink;
   a heat-conducting paste arranged between the contact surface and the power module; and
   a frame part arranged on the contact surface, the power module being accommodated in the frame part;
   wherein the frame part is delimited by a bulge of the heat sink protruding at an edge of the contact surface;
   wherein the heat sink is metallic, and the frame part is made of plastic;
   wherein an inner side of the frame part includes projections that protrude toward the power module, a plurality of the projections contacting the power module; and
   wherein each of the projections is formed on a first side of a respective web of the frame part, the respective web of the frame part delimiting a respective slot in the frame part on a second side of the respective web opposite the first side.

2. The electrical device according to claim 1, wherein the electrical device is arranged as an inverter and/or a converter.

3. The electrical device according to claim 1, wherein the frame part is arranged as an injection-molded part.

4. The electrical device according to claim 1, wherein the power module is electrically connected to a printed circuit board arranged on a side of the power module facing away from the contact surface, and electrical contacts of the power module are pressed onto conductor tracks of the printed circuit board.

5. The electrical device according to claim 4, wherein a retaining plate is arranged on a side of the printed circuit board facing away from the power module, the retaining plate is pressed onto the printed circuit board, and the retaining plate is pressed onto the power module.

6. The electrical device according to claim 5, wherein the frame part includes a positioning pin area supported on the printed circuit board on a side of the printed circuit board facing away from the retaining plate.

7. The electrical device according to claim 4, wherein a retaining plate is arranged on a side of the printed circuit board facing away from the power module, the retaining plate is pressed onto the printed circuit board, by a screw head of a screw at least partially screwed into a threaded hole of the power module, and the retaining plate is pressed onto the power module.

8. The electrical device according to claim 4, wherein the frame part includes a positioning pin area supported on the printed circuit board.

9. The electrical device according to claim 4, wherein the bulge is spaced apart from the printed circuit board, and the power module contacts (i) the heat sink and/or the contact surface of the heat sink and (ii) the printed circuit board.

10. The electrical device according to claim 4, wherein the contact surface is aligned parallel to the printed circuit board.

11. The electrical device according to claim 10, wherein positioning pins are aligned perpendicular to the contact surface.

12. The electrical device according to claim 4, wherein components of signal electronics are arranged on a side of the printed circuit board facing away from the power module, the signal electronics adapted to generate control signals for controlling controllable semiconductor switches of the power module.

13. The electrical device according to claim 1, wherein the projections are arranged as lugs.

14. The electrical device according to claim 1, wherein the power module is accommodated on an inside of the frame part, and an outside of the frame part is accommodated by the heat sink.

15. The electrical device according to claim 1, wherein the power module is accommodated on an inside of the frame part, and an outside of the frame part is accommodated by the bulge.

16. The electrical device according to claim 1, wherein the respective slot extends less in a first direction from the respective slot to the projection than in a second direction perpendicular to the first direction.

17. The electrical device according to claim 1, wherein an outside of the frame part includes projections that protrude toward the bulge, a plurality of the projections contact the bulge, and the bulge includes multiple pieces.

18. The electrical device according to claim 17, wherein the projections are arranged as lugs.

19. The electrical device according to claim 1, wherein the frame part includes two spaced-apart slots on at least one shortest connecting line between the power module and the bulge.

20. The electrical device according to claim 19, wherein a first one of the two slots is arranged closer to the power module than a second one of the two slots.

21. The electrical device according to claim 1, wherein the power module includes controllable semiconductor switches, IGBTs and/or MOSFETs of an inverter.

22. The electrical device according to claim 1, wherein the contact surface is flat.

23. The electrical device according to claim 1, wherein a fan is adapted to convey a cooling air flow along a side of the heat sink facing away from the contact surface.

24. The electrical device according to claim 1, wherein an outer side of the frame part includes further projections that protrude away the first power module, at least one of the further projections contacting the bulge; and
wherein each of the further projections is formed on a first side of a respective further web of the frame part, the respective further web of the frame part delimiting a respective further slot in the frame part on a second side of the respective further web opposite the first side of the respective further web.

25. A method for producing a first and a second electrical device from components of a construction kit, the construction kit including a first power module, a second power module, a frame part, and a heat sink having a contact surface, comprising:
producing the first electrical device by assembling the frame part, the heat sink, and the first power module by:
arranging the first power module on the heat sink with heat-conducting paste interposed between the contact surface and the first power module;
arranging the frame part on the contact surface; and
accommodating the first power module in the frame part, the frame part being delimited by a bulge of the heat sink protruding at an edge of the contact surface; and
producing the second electrical device by assembling the second power module and the heat sink by:
arranging the second power module on the heat sink with heat- conducting paste interposed between the contact surface and the second power module, the second power module being delimited by the bulge of the heat sink protruding at the edge of the contact surface;
wherein an inner side of the frame part includes projections that protrude toward the first power module, a plurality of the projections contacting the first power module; and
wherein each of the projections is formed on a first side of a respective web of the frame part, the respective web of the frame part delimiting a respective slot in the frame part on a second side of the respective web opposite the first side.

26. The method according to claim 25, wherein the first electrical device and/or the second electrical device is arranged as an inverter and/or a converter.

27. The method according to claim 25, wherein a surface area of the contact surface, at which the first power module contacts the contact surface, has a smaller surface area than a surface area of the contact surface, at which the second power module contacts the contact surface.

* * * * *